United States Patent
Lim

(10) Patent No.: US 11,982,718 B2
(45) Date of Patent: May 14, 2024

(54) APPARATUS AND METHOD FOR DETERMINING BATTERY LIFE

(71) Applicants: Hyundai Motor Company, Seoul (KR); Kia Corporation, Seoul (KR)

(72) Inventor: Young Chul Lim, Whasung-Si (KR)

(73) Assignees: Hyundai Motor Company, Seoul (KR); Kia Corporation, Seoul (KR)

( * ) Notice: Subject to any disclaimer, the term of this patent is extended or adjusted under 35 U.S.C. 154(b) by 0 days.

(21) Appl. No.: 17/848,203

(22) Filed: Jun. 23, 2022

(65) Prior Publication Data
US 2023/0152379 A1    May 18, 2023

(30) Foreign Application Priority Data
Nov. 18, 2021    (KR) .................. 10-2021-0159628

(51) Int. Cl.
*G01R 31/3842*    (2019.01)
*G01R 31/00*    (2006.01)

(52) U.S. Cl.
CPC ....... *G01R 31/3842* (2019.01); *G01R 31/005* (2013.01)

(58) Field of Classification Search
CPC .......................... G01R 31/3842; G01R 31/005
See application file for complete search history.

(56) References Cited

U.S. PATENT DOCUMENTS

| | | | |
|---|---|---|---|
| 8,407,018 B2* | 3/2013 | White | G01R 31/392 702/65 |
| 9,172,118 B2* | 10/2015 | Marsh | B60L 3/12 |
| 2009/0027056 A1* | 1/2009 | Huang | G01R 31/392 320/132 |
| 2010/0250162 A1* | 9/2010 | White | G01R 31/392 702/63 |
| 2013/0262002 A1* | 10/2013 | Braun | H02J 7/0013 702/63 |
| 2018/0062401 A1* | 3/2018 | Quiambao | G01R 31/396 |
| 2019/0265306 A1* | 8/2019 | Matsushita | G01R 31/3828 |
| 2020/0341067 A1* | 10/2020 | Ruan | H01M 10/425 |

FOREIGN PATENT DOCUMENTS

KR    10-1646570 B    8/2016

\* cited by examiner

*Primary Examiner* — Manish S Shah
*Assistant Examiner* — Sharad Timilsina
(74) *Attorney, Agent, or Firm* — MORGAN, LEWIS & BOCKIUS LLP

(57) ABSTRACT

A battery life determination apparatus includes a detector that measures a voltage of a battery, and a controller that determines an average value of a battery depth of discharge based on a voltage of the battery depending on a battery discharging after key off of a vehicle and a battery charging while driving of the vehicle, and determines a battery life by comparing a number of start-on times after the key off with a number of battery life end cycles corresponding to the average value, minimizing problems of start-on failures and charging delays, and providing customers with reliable battery information.

18 Claims, 5 Drawing Sheets

APPARATUS AND METHOD FOR DETERMINING BATTERY LIFE

CROSS-REFERENCE TO RELATED APPLICATION

The present application claims priority to Korean Patent Application No. 10-2021-0159628, filed on Nov. 18, 2021, the entire contents of which is incorporated herein for all purposes by this reference.

BACKGROUND OF THE PRESENT DISCLOSURE

Field of the Present Disclosure

The present disclosure relates to an apparatus and a method for determining a battery life.

Description of Related Art

A vehicle battery is not only used to supply power to vehicle's electrical equipment, but is also applied to electric vehicles and used as a driving force for vehicle driving. Accordingly, when a battery life of a vehicle is terminated, because it not only stops the operation of the electrical equipment, but also affects the driving of the vehicle, it is very important to predict the battery life.

In general, the battery life is predicted using a method of measuring the capacity when the battery is fully charged, and as a result, there is a limit in that a dark current generated after a key off of the vehicle is not taken into account in predicting the battery life. Accordingly, it is difficult to accurately predict the battery life, which causes problems such as poor start-on and charging delay, and thus a technology for accurately predicting the battery life is required.

The information included in this Background of the present disclosure section is only for enhancement of understanding of the general background of the present disclosure and may not be taken as an acknowledgment or any form of suggestion that this information forms the prior art already known to a person skilled in the art.

BRIEF SUMMARY

Various aspects of the present disclosure are directed to providing a battery life determination apparatus and method that determine the battery life in consideration of a dark current generated after a key off of a vehicle.

The technical problems to be solved by the present disclosure are not limited to the aforementioned problems, and any other technical problems not mentioned herein will be clearly understood from the following description by those skilled in the art to which the present disclosure pertains.

According to an aspect of the present disclosure, a battery life determination apparatus includes a detector that measures a voltage of a battery, and a controller that determines an average value of a battery depth of discharge based on a voltage of the battery depending on a battery discharging after key off of a vehicle and a battery charging while driving of the vehicle, and determines a battery life by comparing a number of start-on times after the key off with a number of battery life end cycles corresponding to the average value.

In an exemplary embodiment of the present disclosure, the controller may be configured to determine a first SOC value of the battery based on the voltage of the battery measured after the key off of the vehicle, and may determine a second SOC value of the battery based on the voltage of the battery, which is measured after charging when the battery is charged due to the driving of the vehicle.

In an exemplary embodiment of the present disclosure, the controller may be configured to determine the battery depth of discharge based on the first SOC and the second SOC.

In an exemplary embodiment of the present disclosure, the controller may be configured to determine a first DOD based on the first SOC and to determine a second DOD based on the second SOC.

In an exemplary embodiment of the present disclosure, the controller may be configured to determine a difference between the first DOD and the second DOD as the battery depth of discharge.

In an exemplary embodiment of the present disclosure, the controller may be configured to determine an accumulated value by accumulating the determined battery depth of discharge, and may determine the average value by dividing the accumulated value by the number of start-on times.

In an exemplary embodiment of the present disclosure, the apparatus may further include storage the stores the number of battery life end cycles for each battery depth of discharge.

In an exemplary embodiment of the present disclosure, the controller may be configured to determine the number of battery life end cycles corresponding to the average value based on the number of battery life end cycles stored in the storage.

In an exemplary embodiment of the present disclosure, the controller may be configured to determine that the battery life is ended when the number of start-on times after the key off exceeds the number of battery life end cycles corresponding to the average value.

In an exemplary embodiment of the present disclosure, the controller may redetermine the average value when the number of start-on times after the key off does not exceed the number of battery life end cycles corresponding to the average value.

According to an aspect of the present disclosure, a battery life determination method includes determining an average value of a battery depth of discharge based on a voltage of the battery depending on a battery discharging after key off of a vehicle and a battery charging while driving of the vehicle, and determining a battery life by comparing a number of start-on times after the key off with a number of battery life end cycles corresponding to the average value.

In an exemplary embodiment of the present disclosure, the determining of the average value of the battery depth of discharge may include determining a first SOC value of the battery based on the voltage of the battery measured after the key off of the vehicle, and determining a second SOC value of the battery based on the voltage of the battery, which is measured after charging when the battery is charged due to the driving of the vehicle.

In an exemplary embodiment of the present disclosure, the determining of the average value of the battery depth of discharge may include determining the battery depth of discharge based on the first SOC and the second SOC.

In an exemplary embodiment of the present disclosure, the determining of the average value of the battery depth of discharge may include determining a first DOD based on the first SOC and determining a second DOD based on the second SOC.

In an exemplary embodiment of the present disclosure, the determining of the average value of the battery depth of discharge may include determining a difference between the first DOD and the second DOD as the battery depth of discharge.

In an exemplary embodiment of the present disclosure, the determining of the average value of the battery depth of discharge may include determining an accumulated value by accumulating the determined battery depth of discharge, and may determine the average value by dividing the accumulated value by the number of start-on times.

In an exemplary embodiment of the present disclosure, the method may further include storing the number of battery life end cycles for each battery depth of discharge.

In an exemplary embodiment of the present disclosure, the determining of the battery life may include determining the number of battery life end cycles corresponding to the average value based on the number of battery life end cycles stored in the storage.

In an exemplary embodiment of the present disclosure, the determining of the battery life may include determining that the battery life is ended when the number of start-on times after the key off exceeds the number of battery life end cycles corresponding to the average value.

In an exemplary embodiment of the present disclosure, the determining of the battery life may include redetermining the average value when the number of start-on times after the key off does not exceed the number of battery life end cycles corresponding to the average value.

The methods and apparatuses of the present disclosure have other features and advantages which will be apparent from or are set forth in more detail in the accompanying drawings, which are incorporated herein, and the following Detailed Description, which together serve to explain certain principles of the present disclosure.

Figure 1:
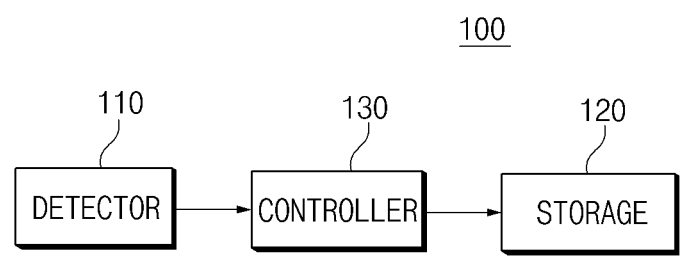
FIG. 1 is a diagram illustrating a configuration of a battery life determination apparatus according to an exemplary embodiment of the present disclosure.

It may be understood that the appended drawings are not necessarily to scale, presenting a somewhat simplified representation of various features illustrative of the basic principles of the present disclosure. The specific design features of the present disclosure as included herein, including, for example, specific dimensions, orientations, locations, and shapes will be determined in part by the particularly intended application and use environment.

In the figures, reference numbers refer to the same or equivalent parts of the present disclosure throughout the several figures of the drawing.

DETAILED DESCRIPTION

Reference will now be made in detail to various embodiments of the present disclosure(s), examples of which are illustrated in the accompanying drawings and described below. While the present disclosure(s) will be described in conjunction with exemplary embodiments of the present disclosure, it will be understood that the present description is not intended to limit the present disclosure(s) to those exemplary embodiments of the present disclosure. On the other hand, the present disclosure(s) is/are intended to cover not only the exemplary embodiments of the present disclosure, but also various alternatives, modifications, equivalents and other embodiments, which may be included within the spirit and scope of the present disclosure as defined by the appended claims.

Hereinafter, various exemplary embodiments of the present disclosure will be described in detail with reference to the drawings. In adding the reference numerals to the components of each drawing, it should be noted that the identical or equivalent component is designated by the identical numeral even when they are displayed on other drawings. Furthermore, in describing the exemplary embodiment of the present disclosure, a detailed description of the related known configuration or function will be omitted when it is determined that it interferes with the understanding of the exemplary embodiment of the present disclosure.

In describing the components of the exemplary embodiment according to an exemplary embodiment of the present disclosure, terms such as first, second, A, B, (a), (b), and the like may be used. These terms are merely intended to distinguish the components from other components, and the terms do not limit the nature, order or sequence of the components. Unless otherwise defined, all terms including technical and scientific terms used herein have the same meaning as commonly understood by one of ordinary skill in the art to which the present disclosure belongs. It will be further understood that terms, such as those defined in commonly used dictionaries, should be interpreted as having a meaning which is consistent with their meaning in the context of the relevant art and will not be interpreted in an idealized or overly formal sense unless expressly so defined herein.

FIG. 1 is a diagram illustrating a configuration of a battery life determination apparatus according to an exemplary embodiment of the present disclosure.

Referring to FIG. 1, a battery life determination apparatus 100 according to an exemplary embodiment of the present disclosure may include a detector 110, storage 120, and a controller 130.

The detector 110 may obtain state information of the battery. According to an exemplary embodiment of the present disclosure, the detector 110 may obtain information on a voltage of the battery, a current of the battery, and a temperature of the battery. The controller 130 may determine a remaining amount (State of Charge: SOC) of the battery based on the information obtained by the detector 110.

The storage 120 may store at least one algorithm for performing operation or execution of various commands for the operation of the battery life determination apparatus according to an exemplary embodiment of the present disclosure. The storage 120 may include at least one storage medium of a flash memory, a hard disk, a memory card, a read-only memory (ROM), a random access memory (RAM), an electrically erasable programmable read-only memory (EEPROM), a programmable read-only memory (PROM), a magnetic memory, a magnetic disk, and an optical disk.

According to an exemplary embodiment of the present disclosure, the storage 120 may store the number of battery life end cycles for each battery depth of discharge (DOD). In the instant case, the battery depth of discharge may mean the amount of discharge of the battery, and may mean that as the numerical value (%) of the battery depth of discharge increases, the amount of discharge of the battery increases, and as the numerical value (%) of the battery depth of discharge decreases, the amount of discharge of the battery decreases. The battery depth of discharge is preferably understood as the opposite concept to the remaining amount of the battery. Furthermore, the number of life end portion cycle times may mean the number of cycles in which charging and discharging are possible until the battery life is terminated.

The number of battery life end cycles for each battery depth of discharge will be described in more detail with reference to FIG. 2.

Figure 2:
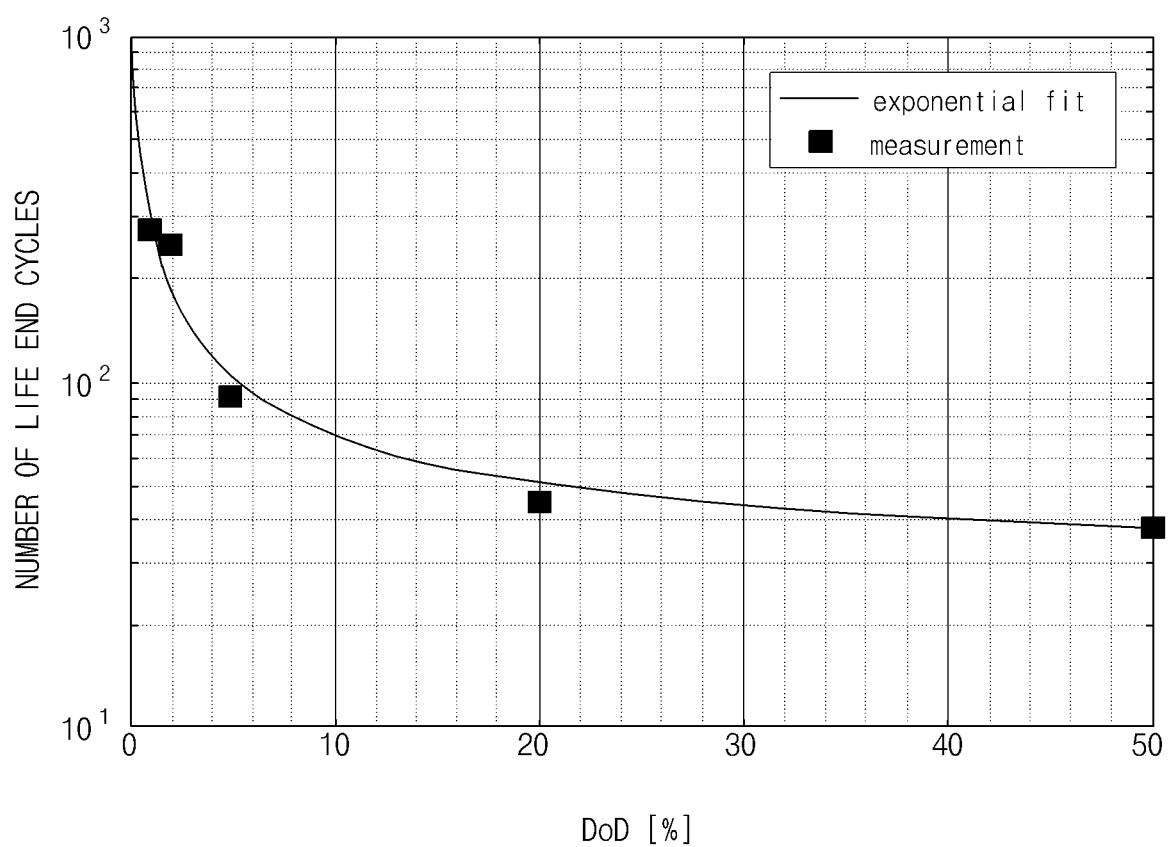
FIG. 2 is a graph illustrating the number of life end cycles according to a battery depth of discharge, according to an exemplary embodiment of the present disclosure.

FIG. 2 is a graph illustrating the number of life end cycles according to a battery depth of discharge, according to an exemplary embodiment of the present disclosure.

According to an exemplary embodiment of the present disclosure, the battery depth of discharge may include cases of 10%, 20%, 30%, 40%, and 50% as illustrated in FIG. 2. The number of end-life cycles according to the battery depth of discharge may be obtained through a performance test in the development stage of the battery.

The controller 130 may be implemented with various processing devices such as a microprocessor in which a semiconductor chip configured for performing operations or execution of various commands is embedded, and may control an operation of the battery life determination apparatus according to an exemplary embodiment of the present disclosure.

The controller 130 may determine an average value of the battery depth of discharge based on a battery voltage depending on a battery discharging after the key off and a battery charging while driving.

In detail, the controller 130 may operate the electrical equipment after the key off of the vehicle. According to an exemplary embodiment of the present disclosure, the controller 130 may operate an OTA (over-the-air: a wireless update) device, a CCS (connected vehicle service) device, and an air conditioner (a blower and a ventilation) after the key off.

The controller 130 may measure the voltage of the battery and determine the first SOC value of the battery when the start-on is controlled after the key off. In the instant case, the reason that the controller 130 determines the first SOC value of the battery is to obtain a discharge amount of the battery which is discharged while the electrical equipment is operated after the key is turned off.

Thereafter, the controller 130 may allow the battery to be charged while the vehicle is driving, and may measure the voltage of the battery and determine the second SOC value of the battery when the driving of the vehicle is completed and the starting is turned off. In the instant case, the reason that the controller 130 determines the second SOC value of the battery is to obtain a charge amount of the battery charged while the vehicle is driving.

The controller 130 may determine the battery depth of discharge based on the first SOC and the second SOC. According to an exemplary embodiment of the present disclosure, the controller 130 may determine a first DOD, which is the amount of discharge that the battery is discharged due to an operation of the electrical equipment before the start-on, based on the first SOC. Furthermore, since the first DOD is changed according to the amount of charge of the battery charged while the vehicle is driving, the controller 130 may determine the second DOD by applying the second SOC to the first DOD. For example, when the first SOC is 70%, the first DOD may be 30%, and when the second SOC is 90%, the second DOD may be 10%.

The controller 130 may determine a difference between the first DOD and the second DOD as the battery depth of discharge. The reason that the controller 130 obtains the battery depth of discharge using the difference between the first DOD and the second DOD is to determine only the actually discharged battery depth of discharge excluding the amount of charge charged while the vehicle is driving. For example, even when the first DOD is 30%, when the second DOD is 10% due to charging while driving the vehicle, the battery depth of discharge may be determined as 20% according to the amount of charge.

The controller 130 may determine the operation until the battery depth of discharge is determined as one cycle after the key off of the vehicle. The controller 130 may repeatedly perform a cycle that determines the first SOC to determine the discharge amount due to the operation of the electrical equipment after the key off again when one cycle ends, and determines the second SOC after starting off when the amount of charge is generated by charging due to the vehicle driving. According to an exemplary embodiment of the present disclosure, the number of cycles described above may be determined as the number of start-on times.

The controller 130 may determine an accumulated value by accumulating the battery depth of discharge determined in each cycle, and may count the number of start-on times operated in each cycle. Furthermore, the controller 130 may determine an average value of the battery depth of discharge by dividing the accumulated value of the battery depth of discharge by the counted start-on times.

The controller 130 may predict the battery life by comparing the number of start-on times after the key off with the number of battery life end cycles corresponding to the average value of the battery depth of discharge.

First, the controller 130 may determine the number of battery life end cycles corresponding to the average value of the battery depth of discharge.

According to an exemplary embodiment of the present disclosure, the controller 130 may determine the number of life end cycles corresponding to the average value of the battery depth of discharge based on the number of life end cycles stored in the storage 120. For example, the controller 130 may match the average value of the battery depth of discharge to an x-axis value (DOD %) in FIG. 2, and may determine the corresponding number of battery life end cycles (a y-axis value).

When the number of life end cycles corresponding to the average value of the battery depth of discharge is determined, the controller 130 may determine whether the number of start-on times exceeds the number of life end cycles corresponding to the average value of the battery depth of discharge.

When it is determined that the number of start-on times exceeds the number of life end cycles corresponding to the average value of the battery depth of discharge, the controller 130 may determine that the battery life is ended. On the other hand, when the number of start-on times after key off does not exceed the number of battery life end cycles corresponding to the average value of the battery depth of discharge, the controller 130 may determine that the battery may be discharged and charged, and may redetermine the average value of the battery depth of discharge after the battery is discharged and charged.

Figure 3:
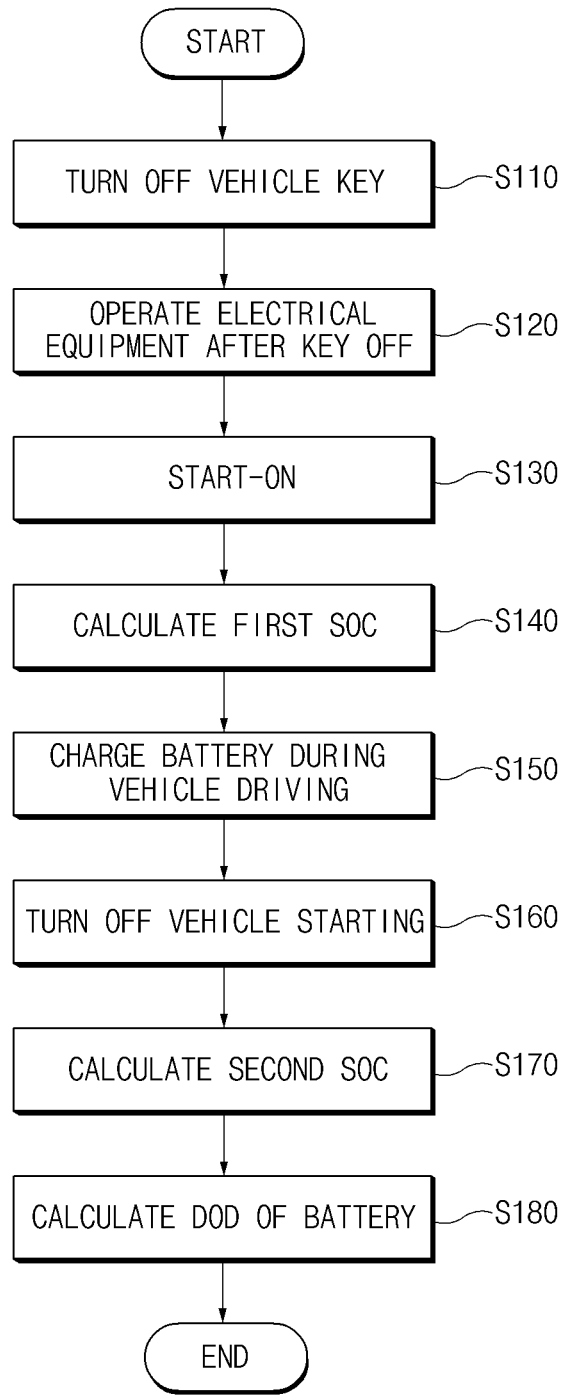
FIG. 3 is a diagram illustrating a battery life determination method according to an exemplary embodiment of the present disclosure.
Figure 4:
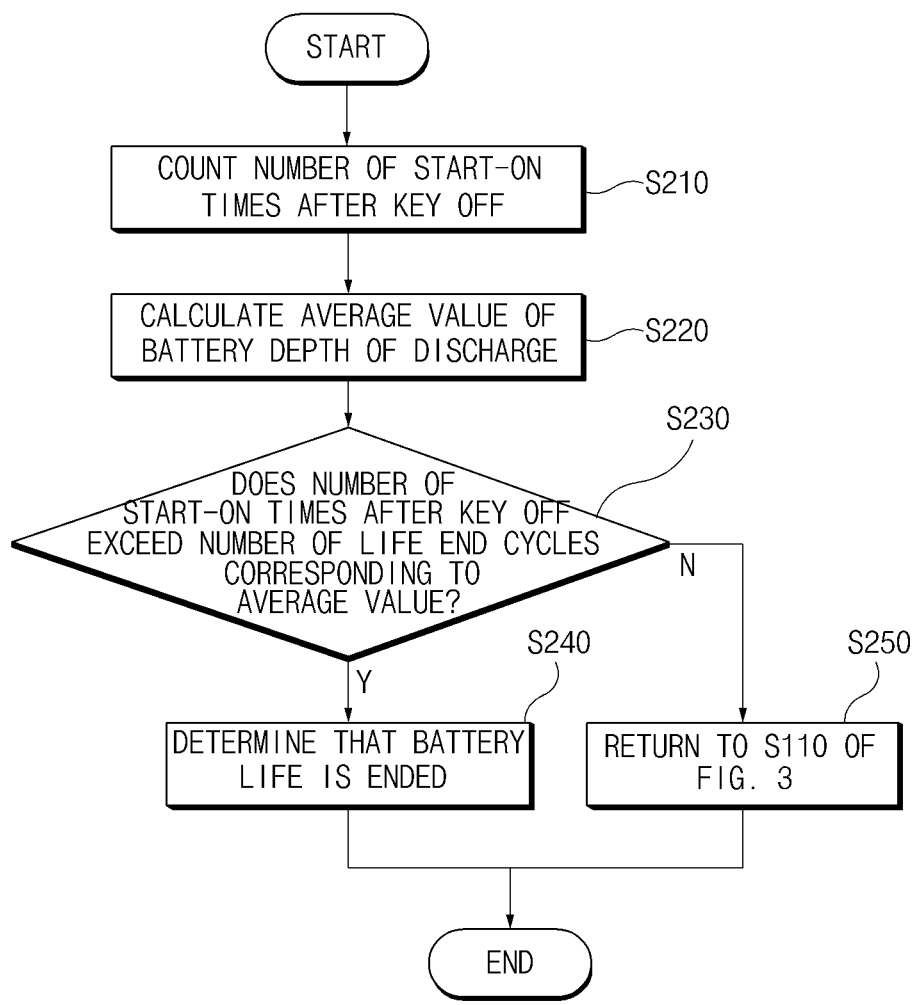
FIG. 4 is a diagram illustrating a battery life determination method according to another exemplary embodiment of the present disclosure.

FIG. 3 is a diagram illustrating a battery life determination method according to an exemplary embodiment of the present disclosure, and FIG. 4 is a diagram illustrating a battery life determination method according to another exemplary embodiment of the present disclosure.

As illustrated in FIG. 3, when it is determined that the key is off (S110), the electrical equipment is operated (S120) and the starting is controlled on after the key off (S130), the controller 130 may measure the voltage of the battery and may determine the first SOC value of the battery (S140). In S140, the reason that the controller 130 determines the first SOC value of the battery is to obtain a discharge amount of the battery which is discharged while the electrical equipment is operated after key off.

Thereafter, the controller 130 may allow the battery to be charged while the vehicle is driving (S150). When the driving of the vehicle is completed and the starting is turned off (S160), the controller 130 may measure the voltage of the battery and may determine the second SOC value of the battery (S170). The reason that the controller 130 determines the second SOC value of the battery in S170 is to obtain the amount of charge of the battery charged while the vehicle is driving in S150.

The controller 130 may determine the battery depth of discharge based on the first SOC and the second SOC.

According to an exemplary embodiment of the present disclosure, in S180, the controller 130 may determine a first DOD, which is the amount of discharge that the battery is discharged due to an operation of the electrical equipment before the start-on, based on the first SOC. Furthermore, since the first DOD is changed according to the amount of charge of the battery charged while the vehicle is driving, the controller 130 may determine the second DOD by applying the second SOC to the first DOD. For example, when the first SOC is 70%, the first DOD may be 30%, and when the second SOC is 90%, the second DOD may be 10%.

Furthermore, the controller 130 may determine the difference between the first DOD and the second DOD as the battery depth of discharge. The reason that the controller 130 obtains the battery depth of discharge using the difference between the first DOD and the second DOD is to determine only the actually discharged battery depth of discharge excluding the amount of charge charged while the vehicle is driving. For example, even when the first DOD is 30%, when the second DOD is 10% due to charging while driving the vehicle, the battery depth of discharge may be determined as 20% according to the amount of charge.

Although not illustrated thereafter, the controller 130 may repeatedly perform S110 to S180.

As illustrated in FIG. 4, the controller 130 may determine the battery depth of discharge based on the battery information obtained in S110 to S180. According to an exemplary embodiment of the present disclosure, the controller 130 may accumulate the battery depth of discharge determined in each cycle to determine an accumulated value, and may count the number of start-on times operated in each cycle (S210). Furthermore, the controller 130 may determine an average value of the battery depth of discharge by dividing the accumulated value of the battery depth of discharge by the counted start-on times (S220).

The controller 130 may predict the battery life by comparing the number of start-on times after the key off with the number of battery life end cycles corresponding to the average value of the battery depth of discharge (S230).

In S230, the controller 130 may determine the number of battery life end cycles corresponding to the average value of the battery depth of discharge.

According to an exemplary embodiment of the present disclosure, the controller 130 may determine the number of life end cycles corresponding to the average value of the battery depth of discharge based on the number of life end cycles stored in the storage 120. For example, the controller 130 may match the average value of the battery depth of discharge to the x-axis value (DOD %) in FIG. 2, and may determine the corresponding number of battery life end cycles (the y-axis value).

When the number of life end cycles corresponding to the average value of the battery depth of discharge is determined, the controller 130 may determine whether the number of start-on times exceeds the number of life end cycles corresponding to the average value of the battery depth of discharge.

In S230, when it is determined that the number of start-on times exceeds the number of life end cycles corresponding to the average value of the battery depth of discharge (Y), the controller 130 may determine that the battery life is ended (S240).

On the other hand, in S230, the controller 130 may determine that the battery may be discharged and charged when the number of start-on times after the key off does not exceed the number of battery life end cycles corresponding to the average value of the battery depth of discharge (N), may redetermine the battery depth of discharge by performing S110 to S180 of FIG. 3 again (S250).

In an exemplary embodiment of the present invention, a display may be connected to the controller 130 to show the FIG. 2 or a result of FIGS. 3 and 4.

Figure 5:
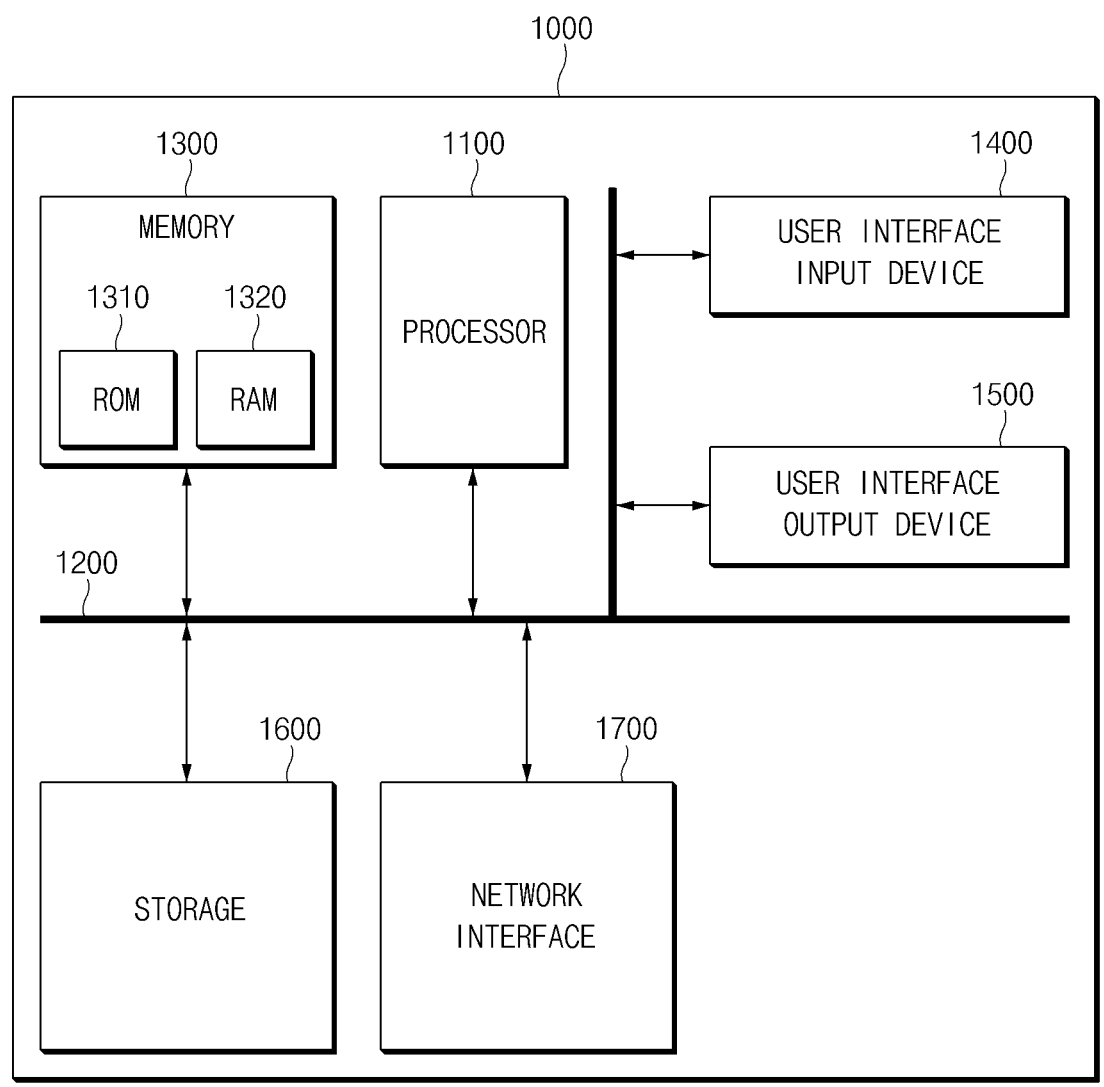
FIG. 5 is a diagram illustrating a configuration of a determining system according to an exemplary embodiment of the present disclosure.

FIG. 5 is a diagram illustrating a configuration of a computing system according to an exemplary embodiment of the present disclosure.

Referring to FIG. 5, a computing system 1000 may include at least one processor 1100, a memory 1300, a user interface input device 1400, a user interface output device 1500, storage 1600, and a network interface 1700, which are connected to each other via a bus 1200.

The processor 1100 may be a central processing unit (CPU) or a semiconductor device that processes instructions stored in the memory 1300 and/or the storage 1600. Each of the memory 1300 and the storage 1600 may include various types of volatile or nonvolatile storage media. For example, the memory 1300 may include a read only memory (ROM) 1310 and a random access memory (RAM) 1320.

Accordingly, the operations of the method or algorithm described in connection with the exemplary embodiments included in the specification may be directly implemented with a hardware module, a software module, or a combination of the hardware module and the software module, which is executed by the processor 1100. The software module may reside on a storage medium (i.e., the memory 1300 and/or the storage 1600) such as a random access memory (RAM), a flash memory, a read only memory (ROM), an erasable and programmable ROM (EPROM), an electrically EPROM (EEPROM), a register, a hard disk drive, a removable disc, or a compact disc-ROM (CD-ROM). The storage medium may be coupled to the processor 1100. The processor 1100 may read out information from the storage medium and may write information in the storage medium. Alternatively, the storage medium may be integrated with the processor 1100. The processor and storage medium may be implemented with an application specific integrated circuit (ASIC). The ASIC may be provided in a user terminal. Alternatively, the processor and storage medium may be implemented with separate components in the user terminal.

According to an exemplary embodiment of the present disclosure, a battery life determination apparatus and method may accurately predict the battery life by use of a battery depth of discharge depending on a battery discharging after key off of a vehicle and a battery charging while driving. Furthermore, it is possible to minimize problems of start-on failure and charging delay, and to provide users with battery information with improved reliability.

The above description is merely illustrative of the technical idea of the present disclosure, and those of ordinary skill in the art to which the present disclosure pertains will be able to make various modifications and variations without departing from the essential characteristics of the present disclosure.

Furthermore, the term related to a control device such as "controller", "control apparatus", "control unit", "control device", "control module", or "server", etc refers to a hardware device including a memory and a processor configured to execute one or more steps interpreted as an algorithm structure. The memory stores algorithm steps, and the processor executes the algorithm steps to perform one or more processes of a method in accordance with various exemplary embodiments of the present disclosure. The control device according to exemplary embodiments of the present disclosure may be implemented through a nonvolatile memory configured to store algorithms for controlling operation of various components of a vehicle or data about software commands for executing the algorithms, and a processor configured to perform operation to be described above using the data stored in the memory. The memory and the processor may be individual chips. Alternatively, the memory and the processor may be integrated in a single chip. The processor may be implemented as one or more processors. The processor may include various logic circuits and operation circuits, may process data according to a program provided from the memory, and may generate a control signal according to the processing result.

The control device may be at least one microprocessor operated by a predetermined program which may include a series of commands for carrying out the method included in the aforementioned various exemplary embodiments of the present disclosure.

The aforementioned invention can also be embodied as computer readable codes on a computer readable recording medium. The computer readable recording medium is any data storage device that can store data which may be thereafter read by a computer system and store and execute program instructions which may be thereafter read by a computer system. Examples of the program instruction include machine language code such as those generated by a compiler, as well as high-level language code which may be executed by a computer using an interpreter or the like.

In various exemplary embodiments of the present disclosure, each operation described above may be performed by a control device, and the control device may be configured by multiple control devices, or an integrated single control device.

In various exemplary embodiments of the present disclosure, the control device may be implemented in a form of hardware or software, or may be implemented in a combination of hardware and software.

Furthermore, the terms such as "unit", "module", etc. Included in the specification mean units for processing at least one function or operation, which may be implemented by hardware, software, or a combination thereof.

For convenience in explanation and accurate definition in the appended claims, the terms "upper", "lower", "inner", "outer", "up", "down", "upwards", "downwards", "front", "rear", "back", "inside", "outside", "inwardly", "outwardly", "interior", "exterior", "internal", "external", "forwards", and "backwards" are used to describe features of the exemplary embodiments with reference to the positions of such features as displayed in the figures. It will be further understood that the term "connect" or its derivatives refer both to direct and indirect connection.

The foregoing descriptions of specific exemplary embodiments of the present disclosure have been presented for purposes of illustration and description. They are not intended to be exhaustive or to limit the present disclosure to the precise forms disclosed, and obviously many modifications and variations are possible in light of the above teachings. The exemplary embodiments were chosen and described to explain certain principles of the present disclosure and their practical application, to enable others skilled in the art to make and utilize various exemplary embodiments of the present disclosure, as well as various alternatives and modifications thereof. It is intended that the scope of the present disclosure be defined by the Claims appended hereto and their equivalents.

What is claimed is:

1. A battery life determination apparatus comprising:
   a detector configured to measure a voltage of a battery; and
   a controller configured to determine an average value of a battery depth of discharge based on a first voltage of the battery depending on a battery discharging by operating an electric equipment after key off of a vehicle and a second voltage of the battery depending on a battery charging while driving of the vehicle by allowing the battery to be charged while the vehicle is driving, and to determine a battery life by comparing a number of start-on times after the key off with a number of battery life end cycles corresponding to the average value,
   wherein the controller is configured to determine that the battery life is ended when the number of start-on times after the key off exceeds the number of battery life end cycles corresponding to the average value.

2. The battery life determination apparatus of claim 1, wherein the controller is configured to determine a first SOC value of the battery based on the first voltage of the battery measured after the key off of the vehicle, and to determine a second SOC value of the battery based on the second voltage of the battery, which is measured after charging when the battery is charged due to the driving of the vehicle.

3. The battery life determination apparatus of claim 2, wherein the controller is configured to determine the battery depth of discharge based on the first SOC and the second SOC.

4. The battery life determination apparatus of claim 3, wherein the controller is configured to determine a first DOD based on the first SOC and to determine a second DOD based on the second SOC.

5. The battery life determination apparatus of claim 4, wherein the controller is configured to determine a difference between the first DOD and the second DOD as the battery depth of discharge.

6. The battery life determination apparatus of claim 3, wherein the controller is configured to determine an accumulated value by accumulating the determined battery depth of discharge, and to determine the average value by dividing the accumulated value by the number of start-on times.

7. The battery life determination apparatus of claim 1, further including:
   a storage configured to store the number of battery life end cycles for each battery depth of discharge.

8. The battery life determination apparatus of claim 7, wherein the controller is configured to determine the number of battery life end cycles corresponding to the average value based on the number of battery life end cycles stored in the storage.

9. The battery life determination apparatus of claim 1, wherein the controller redetermines the average value when the number of start-on times after the key off does not exceed the number of battery life end cycles corresponding to the average value.

10. A method of determining a battery life, the method comprising:
   determining, by a controller, an average value of a battery depth of discharge based on a first voltage of a battery depending on a battery discharging by operating an electric equipment after key off of a vehicle and a second voltage of the battery depending on a battery charging while driving of the vehicle by allowing the battery to be charged while the vehicle is driving; and
   determining, by the controller, a battery life by comparing a number of start-on times after the key off with a number of battery life end cycles corresponding to the average value,
   wherein the determining of the battery life includes:
   determining, by the controller, that the battery life is ended when the number of start-on times after the key off exceeds the number of battery life end cycles corresponding to the average value.

11. The method of claim 10, wherein the determining of the average value of the battery depth of discharge includes:
   determining, by the controller, a first SOC value of the battery based on the first voltage of the battery measured after the key off of the vehicle; and
   determining, by the controller, a second SOC value of the battery based on the second voltage of the battery, which is measured after charging when the battery is charged due to the driving of the vehicle.

12. The method of claim 11, wherein the determining of the average value of the battery depth of discharge includes:
   determining, by the controller, the battery depth of discharge based on the first SOC and the second SOC.

13. The method of claim 12, wherein the determining of the average value of the battery depth of discharge includes:
   determining, by the controller, a first DOD based on the first SOC and determining a second DOD based on the second SOC.

14. The method of claim 13, wherein the determining of the average value of the battery depth of discharge includes:
   determining, by the controller, a difference between the first DOD and the second DOD as the battery depth of discharge.

15. The method of claim 12, wherein the determining of the average value of the battery depth of discharge includes:
   determining, by the controller, an accumulated value by accumulating the determined battery depth of discharge, and determining the average value by dividing the accumulated value by the number of start-on times.

16. The method of claim 10, further including:
   storing, by the controller, the number of battery life end cycles for each battery depth of discharge, in a storage.

17. The method of claim 16, wherein the determining of the battery life includes:
   determining, by the controller, the number of battery life end cycles corresponding to the average value based on the number of battery life end cycles stored in the storage.

18. The method of claim 10, wherein the determining of the battery life includes:
   redetermining, by the controller, the average value when the number of start-on times after the key off does not exceed the number of battery life end cycles corresponding to the average value.

* * * * *